US012598977B2

(12) United States Patent
Chen et al.

(10) Patent No.: US 12,598,977 B2
(45) Date of Patent: Apr. 7, 2026

(54) FILL OF VIAS IN SINGLE AND DUAL DAMASCENE STRUCTURES USING SELF-ASSEMBLED MONOLAYER

(71) Applicant: Intel Corporation, Santa Clara, CA (US)

(72) Inventors: Jiun-Ruey Chen, Hillsboro, OR (US); Christopher Jezewski, Portland, OR (US); John Plombon, Portland, OR (US); Miriam Reshotko, Portland, OR (US); Mauro Kobrinsky, Portland, OR (US); Scott B. Clendenning, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 960 days.

(21) Appl. No.: 17/558,423

(22) Filed: Dec. 21, 2021

(65) Prior Publication Data

US 2023/0197601 A1      Jun. 22, 2023

(51) Int. Cl.
| | |
|---|---|
| *H01L 23/522* | (2006.01) |
| *H01L 21/768* | (2006.01) |
| *H01L 23/532* | (2006.01) |

(52) U.S. Cl.
CPC .... *H01L 23/5226* (2013.01); *H01L 21/76807* (2013.01); *H01L 21/76831* (2013.01); *H01L 21/76879* (2013.01); *H01L 23/53238* (2013.01); *H01L 23/5328* (2013.01)

(58) Field of Classification Search
CPC ......... H01L 21/76831; H01L 21/76879; H01L 23/5226
See application file for complete search history.

(56) References Cited

U.S. PATENT DOCUMENTS

| | | | | |
|---|---|---|---|---|
| 9,362,231 | B2 * | 6/2016 | Chiang | ............. H01L 21/76814 |
| 10,727,065 | B2 * | 7/2020 | Su | ...................... H01L 21/76897 |
| 11,848,236 | B2 * | 12/2023 | deVilliers | ......... H01L 21/76883 |
| 2016/0118296 | A1 | 4/2016 | Kolics et al. | |
| 2018/0130707 | A1 | 5/2018 | Clendenning et al. | |
| 2019/0006230 | A1 | 1/2019 | Kuo et al. | |
| 2020/0118871 | A1 * | 4/2020 | Yu | ...................... H01L 21/76888 |
| 2021/0313228 | A1 | 10/2021 | Nguyen et al. | |
| 2021/0335663 | A1 | 10/2021 | Hsueh et al. | |
| 2022/0139776 | A1 * | 5/2022 | Yu | ...................... H01L 21/76864 |
| | | | | 438/282 |

OTHER PUBLICATIONS

Extended European Search Report from European Patent Application No. 22207204.3 notified Mar. 21, 2023, 7 pgs.
Intention to Grant from European Patent Application No. 22207204.3 notified Apr. 28, 2025, 8 pgs.

* cited by examiner

*Primary Examiner* — Daniel Luke
(74) *Attorney, Agent, or Firm* — Essential Patents Group, LLP

(57) ABSTRACT

Metallization interconnect structures, integrated circuit devices, and methods related to high aspect ratio interconnects are discussed. A self assembled monolayer is selectively formed on interlayer dielectric sidewalls of an opening that exposes an underlying metallization structure. A first metal is formed on the underlying metallization structure and within only a bottom portion of the self assembled monolayer. The exposed portion of the self assembled monolayer is removed and a second metal is formed over the first metal.

22 Claims, 10 Drawing Sheets

200

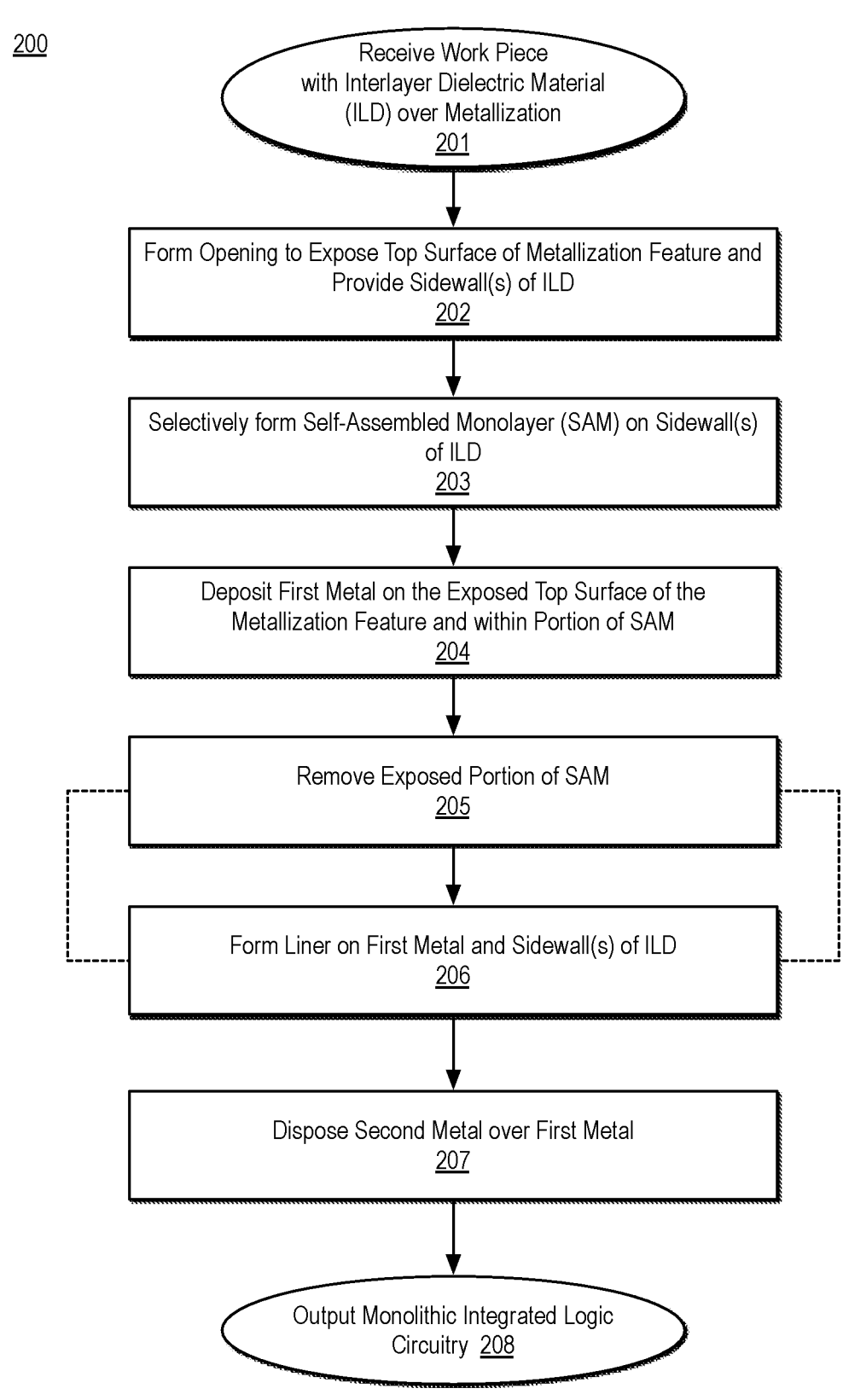

Receive Work Piece
with Interlayer Dielectric Material
(ILD) over Metallization
201

Form Opening to Expose Top Surface of Metallization Feature and
Provide Sidewall(s) of ILD
202

Selectively form Self-Assembled Monolayer (SAM) on Sidewall(s)
of ILD
203

Deposit First Metal on the Exposed Top Surface of the
Metallization Feature and within Portion of SAM
204

Remove Exposed Portion of SAM
205

Form Liner on First Metal and Sidewall(s) of ILD
206

Dispose Second Metal over First Metal
207

Output Monolithic Integrated Logic
Circuitry 208

FIG. 2

FILL OF VIAS IN SINGLE AND DUAL DAMASCENE STRUCTURES USING SELF-ASSEMBLED MONOLAYER

BACKGROUND

Metallization for interconnects such as back end of line (BEOL) has become more challenging as the scaling of transistors to smaller and smaller dimensions continues. In particular, gap fill in trenches and vias (dual damascene) or vias only (single damascene) in smaller critical dimensions and higher aspect ratios is needed. For example, current gap fill processing is able to provide full metal fill up to particular aspect ratios (depending on gap fill materials and other specifics). But, beyond such aspect ratios, attempts to gap fill higher aspect ratio openings causes voids in the fill metal and other problems. Such difficulties cause reliability issues and higher via resistance.

It is with respect to these and other considerations that the present improvements have been needed. Such improvements may become critical as the need to provide high quality, reliable interconnect metallization is needed to support ever smaller transistor and to minimize RC delay. Such reduced transistor sizes and minimized RC delay is critical to improving transistor performance in a variety of integrated circuit applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2 is a flow diagram illustrating an example process for forming an integrated circuit structure having a high aspect ratio metallization feature;

DETAILED DESCRIPTION

Figures 1A, 1B, 1C:
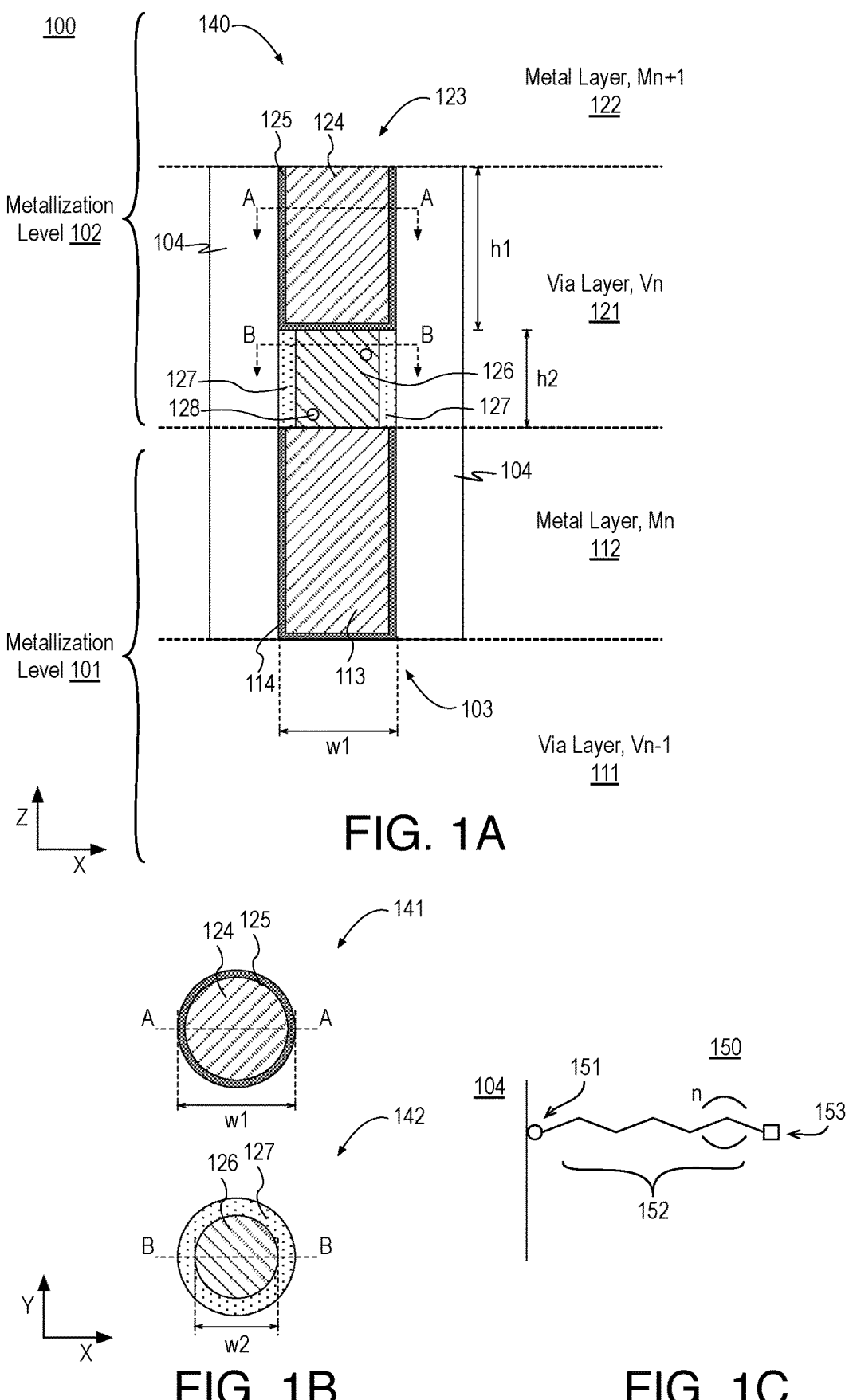
FIG. 1A illustrates a cross-sectional view of an integrated circuit device structure having a high aspect ratio metallization feature or structure.
FIG. 1B illustrates cross-sectional views of the integrated circuit device structure of FIG. 1A taken at a planes through a metal portions of a metallization structure.
FIG. 1C illustrates an example blocking self-assembled monolayer molecule of the integrated circuit device structure of FIG. 1A.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage. As used herein, the terms "monolithic", "monolithically integrated", and similar terms indicate the components of the monolithic overall structure form a indivisible whole not reasonably capable of being separated.

Interconnect structures, integrated circuits, and techniques are described herein related to high aspect ratio vias and metallization for interconnecting devices such as transistor devices.

As discussed, it is desirable to increase the aspect ratio of back end of line (BEOL) interconnect structures such as trenches and vias (dual damascene) or vias only (single damascene) in such BEOL interconnects. In particular, metallization fill for such interconnect structures is challenging as the scaling of transistors to smaller dimensions increases the need for high aspect ratio metallization structures. For example, metallization fill processing has limitations as aspect ratios increase that cause difficulties such as voids in the fill metal. Depending on materials, processing conditions, and other factors such difficulties may arise at aspect ratios (ratio of height to width) in the range of 2.5 to 5 for dual damascene metallization features and in the range of 1 to 2.5 for single damascene metallization features, although the techniques discussed herein may be deployed in any aspect ratio context.

In some embodiments, self-assembled monolayers are deployed to enable prefill features with high aspect ratios by selectively depositing metal layers at the bottom of vias to reduce the aspect ratio needed by the subsequent gap fill. For example, the height of the metallization feature (e.g., via) is increased by the height of the prefill metal while the remaining fill may be performed at aspect ratios attainable using the particular processing conditions. For example, given a process capable of an aspect ratio of h1/w1, a prefill feature of height h2 increases the attainable aspect ratio of the overall metallization feature to (h1+h2)/w1. As used herein, the term self-assembled monolayer indicates a layer made up of molecules having a head group that selectively attaches to particular surfaces and a tail group that provides passivation of the covered surface. The molecules of the self-assembled monolayer may be any suitable molecules as discussed herein. In some embodiments, the self-assembled monolayer molecules are selected to only passivate exposed interlayer dielectric (ILD) materials while the underlying metallization feature being contacted is not passivated. Metal deposition of a first metal is then performed selectively on the clean underlying metallization feature surface (providing high quality electric contact) but not on the passivated sidewalls. Subsequently, metal fill of the opening is performed at an attainable aspect ratio to fully fill the opening (e.g., via only or line and via) with a second metal without voids or other processing defects. Thereby, the aspect ratio of the overall metallization feature is increased to allow reduced lateral sizes of the features, reduced pitches, greater density, and so on for improved performance.

FIG. 1A illustrates a cross-sectional view 140 of an integrated circuit device structure 100 having a high aspect ratio metallization feature or structure 123, arranged in accordance with at least some implementations of the present disclosure. As used herein, the term metallization feature or structure indicates a portion or part of a metallization layer or level that may include two or more metals. In FIG. 1A, cross-sectional view 140 provides a partial view taken at a first metallization level 101 and a second metallization level 102 such that second metallization level 102 is over first metallization level 101 (e.g., at a higher z-height).

In FIG. 1A, a metallization structure 103 of a metal layer 112 of first metallization level 101 is illustrated. Metallization structure 103 includes a barrier or liner material 114 and a fill metal 113. For example, fill metal 113 may be copper. Metallization level 101 may also include a via structure (not shown) of a vial layer 111. In some embodiments, vial layer 111 is a contact layer that directly contacts underlying devices such as transistor devices. Metallization level 101 and metallization level 102 may be over a substrate (not shown) having a device layer. For example, the device layer may include transistors, memory devices, capacitors, resistors, optoelectronic devices, switches, or any other active or passive electronic devices, or portions thereof. The device layer may be disposed over and/or within a substrate that may include a semiconductor material such as monocrystalline silicon (Si), germanium (Ge), silicon germanium (SiGe), a III-V materials based material (e.g., gallium arsenide (GaAs)), a silicon carbide (SiC), a sapphire (Al$_2$O$_3$), or any combination thereof. Furthermore, additional metallization levels may be over metallization levels 101, 102, leading to routing to devices outside of integrated circuit device structure 100. Metallization level 102 may contact any suitable underlying metallization level or structure as exemplified by metallization structure 103. Herein, the terms metallization structure and feature are used interchangeably. Metallization structures 103, 123 are within interlayer dielectric material 104. Interlayer dielectric material 104 may be the same material or may include any number of material layers such as differing material layers in the build up direction (e.g., layers extending in the x-y plane).

As shown, metallization feature or structure 123 may be a feature of a via layer 121 of metallization level 102. Metallization structure 123 includes a first metal portion 126 that is on and in direct contact with metallization structure 103 and a second metal portion 124 that is over first metal portion 126 with an optional liner material 125 therebetween. In some embodiments, first metal portion 126 and second metal portion 124 are different metals. In some embodiments, metallization structure 123 also includes a third portion that is the same metal as second metal portion 124 such that the third portion is part of metal layer 122. Such embodiments are illustrated herein below with respect to FIGS. 3A-3F. Notably, FIG. 1A illustrates a single damascene via contacting metallization structure 103 or a portion of a dual damascene metallization feature inclusive of a via contacting metallization structure 103.

Underlying metallization structure 103 may include any suitable fill metal 113 such as copper, cobalt, tungsten, titanium, aluminum, ruthenium, molybdenum or others. In some embodiments, fill metal 113 is copper within liner material 114 such that liner material 114 includes one or more of tantalum, tantalum and nitrogen (e.g., tantalum nitride), titanium, titanium and nitrogen (e.g., titanium nitride), or tantalum and cobalt. In some embodiments, liner material 114 is not used.

As discussed, a high aspect ratio metallization structure 123 is desirable in a variety of contexts. Notably, there may be limitation that prevents filling a via at an aspect ratio greater than h1/w1 (i.e., in only providing liner material 125 and the fill metal of second metal portion 124 to achieve the via structure). Depending on materials and other fabrication factors, the limitation of the h1/w1 may be in the range of 1 to 5, for example. To increase the overall aspect ratio of metallization structure 123, a process flow as discussed herein is deployed that provides metallization structure 123 having first metal portion 126 and second metal portion 124, and optional liner material 125. For example, absent first metal portion 126, extending second metal portion 124 to an aspect ratio to (h1+h2)/w1 would not be possible without defects or other problems. The resultant aspect ratio of metallization structure 123 (i.e., (h1+h2)/w1) may be any suitable aspect ratio. In some embodiments, the aspect ratio is in the range of 2 to 10. In some embodiments, the aspect ratio is in the range of 2.5 to 5. In some embodiments, the aspect ratio is in the range of 4 to 8. In some embodiments, the aspect ratio is in the range of 5 to 10. Other aspect ratios may be attained.

Although illustrated with respect to separate first and second metal portions 126, 124, in some embodiments, both portions are the same metal or high aspect ratio metallization structure 123 includes only a single metal portion. For example, self-assembled monolayer 127 may extend to a top of high aspect ratio metallization structure 123 and high aspect ratio metallization structure 123 may include only a single fill metal. Such a case may be an extreme case where the entirety of fill is provided as first metal portion 126 adjacent self-assembled monolayer 127. Such example may provide high aspect ratio metallization structure 123 and simplified processing.

FIG. 1B illustrates a cross-sectional view 141 of integrated circuit device structure 100 taken at a plane (A-A) through second metal portion 124 of metallization structure 123 and a cross-sectional view 142 of integrated circuit device structure 100 taken at a plane (B-B) through first metal portion 126 of metallization structure 123, arranged in accordance with at least some implementations of the present disclosure. As shown, in some embodiments, a width w1 of second metal portion 124 (inclusive of liner material 125 or exclusive of liner material 125) is greater than a width w2 of first metal portion 126 due to the inclusion of self-assembled monolayer 127 between first metal portion 126 and the surrounding interlayer dielectric material 104. That is, the metal prefill of first metal portion 126 is narrower than the fill of metal (e.g., copper) of second metal portion 124 in some embodiments. Interlayer dielectric material 104 may be any suitable dielectric material. In some embodiments, interlayer dielectric material 104 is or includes silicon oxide or a silicon oxide based material (e.g., doped silicon oxide, silicon oxynitride, etc.). In some embodiments, interlayer dielectric material 104 is or includes carbon doped oxide or a carbon doped oxide based material.

First metal portion 126 may include any metal and may be a metal other than that of second metal portion 124. For example, the metal of second metal portion 124 may be characterized as a fill metal or bulk metal and may advantageously be copper. In some embodiments, first metal portion 126 is or includes ruthenium. In some embodiments, first metal portion 126 is or includes cobalt. In some embodiments, first metal portion 126 is or includes tungsten. In some embodiments, first metal portion 126 is or includes titanium. In some embodiments, first metal portion 126 is or includes aluminum. Other metals may be deployed. As discussed, in some embodiments, second metal portion 124 is or includes copper. However, other metal systems may be used. In some embodiments, second metal portion 124 is or includes one or more of cobalt, tungsten, titanium, aluminum, ruthenium, molybdenum, manganese, nickel, rhenium, osmium, iridium, platinum, rhodium, or palladium, or others. In examples where second metal portion 124 is or includes copper, liner material 125 may advantageously reduce or eliminate the diffusion. Liner material 125 may include any suitable diffusion barrier such as one or more of tantalum, tantalum and nitrogen (e.g., tantalum nitride), titanium, titanium and nitrogen (e.g., titanium nitride), or tantalum and cobalt. In some embodiments, liner material 125 is not deployed.

Turning now to self-assembled monolayer 127, as shown, self-assembled monolayer 127 is on portions of sidewalls of interlayer dielectric material 104 and between first metal portion 126 and the sidewalls of interlayer dielectric material 104. However, self-assembled monolayer 127 is absent the top surface of metallization structure 103 due to self-assembled monolayer 127 selectively forming on interlayer dielectric material 104 and not on metallization structure 103. In some embodiments, self-assembled monolayer 127 may have a tapered edge such that its width decreases moving toward on metallization structure 103 due to the lack of formation on metallization structure 103.

Self-assembled monolayer 127 may include any molecules that are suitable to selective formation on interlayer dielectric material 104 and not on metallization structure 103 (i.e., not on fill metal 113 such as copper fill). For example, a head group of the molecules of self-assembled monolayer 127 may adsorb or attach to interlayer dielectric material 104 (while not attaching to metals). The molecules of self-assembled monolayer 127 may include any suitable molecule that has a group to bind to interlayer dielectric material 104 (e.g., a head group) and a portion or group to passivate interlayer dielectric material 104 (e.g., a tail or tail group) during metal deposition. In some embodiments, silicon based head groups are deployed with different ligands such as chloral or amino ligands with the silicon atom at the center of the head group selectively binding to interlayer dielectric material 104. In some embodiments, the molecules of self-assembled monolayer 127 include fluorinated alkyl silanes (inclusive of F). For example, the molecules of self-assembled monolayer 127 may be 1H, 1H, 2H, 2H-perfluorooctyltrichlorosilane (FOTS) or (heptadecafluoro-1,1,2,2-tetrahydrodecyl)triethoxysilane (HDF- TEOS). In some embodiments, the molecules of self-assembled monolayer 127 include alkyl chlorosilanes (inclusive of Cl). For example, the molecules of self-assembled monolayer 127 may be octadecyltrichlorosilane (ODTS). In some embodiments, the molecules of self-assembled monolayer 127 include phosphonates (inclusive of P). For example, the molecules of self-assembled monolayer 127 may be octadecylphosphonic acid (OPA) or octadecylphosphonic acid (ODPA). In some embodiments, the molecules of self-assembled monolayer 127 include aminosilanes (inclusive of N). For example, the molecules of self-assembled monolayer 127 may be bis(N,N-dimethylamino)dimethylsilane (DMADMS) or (N,N-dimethylamino)trimethylsilane (DMATMS). Combinations of such materials may be used.

FIG. 1C illustrates an example blocking self-assembled monolayer molecule 150 of integrated circuit device structure 100, arranged in accordance with at least some implementations of the present disclosure. As shown in FIG. 1C, blocking self-assembled monolayer molecule 150 may include a head group 151, a tail 152, and, optionally, a tail functional group 153. As discussed, head group 151 may adsorb or otherwise attach to interlayer dielectric material 104. Head group 151 may include any suitable functional group that may attach to interlayer dielectric material 104 but not to an exposed metal. For example, head group 151 may include one or more of a silane, a chlorosilane, a phosphonate, an aminosilane, a siloxane, a silyl chloride, an alkene, an alkyne, an amine, a phosphine, a thiol, a phosphonic acid, or a carboxylic acid. Furthermore, tail 152 may include any type and number of connecting group such as 2 to 18 alkyl groups or the like. For example, blocking self-assembled monolayer molecule 150 may have a (e.g. C2-C18) alkyl chain to passivate interlayer dielectric material 104. Furthermore, blocking self-assembled monolayer molecule 150 may include an optional functional tail group 153. For example, head group of self-assembled monolayer molecule 150 attaches to and is coupled to interlayer dielectric material 104 and tail 152 (and optional tail group 153) extends from and is distal interlayer dielectric material 104 to passivate interlayer dielectric material 104 such that a metallization does not form thereon.

Returning to FIG. 1A, as shown with respect to self-assembled monolayer (SAM) residual 128, in some embodiments, first metal portion 126 includes residuals of the molecules of self-assembled monolayer 127. SAM residuals 128 may be any suitable portions of the SAM molecules. In some embodiments, SAM residuals 128 include an entire intact SAM molecule. In some embodiments, SAM residuals 128 include portions of SAM modules such as head groups, tails, portions of head groups, portions of tails, etc. In some embodiments, SAM residuals 128 are or include silane. In some embodiments, SAM residuals 128 are or include phosphonate. In some embodiments, SAM residuals 128 are or include fluorine. In some embodiments, SAM residuals 128 are or include chlorine. In some embodiments, SAM residuals 128 are or include phosphorous. In some embodiments, SAM residuals 128 are or include nitrogen. In some embodiments, SAM residuals 128 are or include a silane, a chlorosilane, a phosphonate, an aminosilane, a siloxane, a silyl chloride, an alkene, an alkyne, an amine, a phosphine, a thiol, a phosphonic acid, or a carboxylic acid. In some embodiments, SAM residuals 128 are or include carbon and hydrogen. SAM residuals 128 may include other elemental or molecular residuals from the molecules of self-assembled monolayer 127.

As discussed, integrated circuit device structure 100 (e.g., an integrated circuit device) includes metallization level 101 including metallization feature or structure 103. Metallization level 102 is over metallization level 101 and metallization level includes metallization feature or structure 123 metallization feature or structure 103 and within interlayer dielectric material 104 (e.g., embedded within interlayer dielectric material 104). Metallization feature or structure 123 includes first metal portion 126 on metallization feature or structure 103 and second metal portion 124 over first metal portion 126 such that first metal portion 126 is or includes a first metal and second metal portion 124 is or includes a second metal. Integrated circuit device structure 100 further includes a layer (self-assembled monolayer 127) between first metal portion 126 of metallization feature or structure 123 and interlayer dielectric material 104 such that the layer includes a number of molecules having at least head groups 151 adjacent interlayer dielectric material 104 (i.e., coupled to interlayer dielectric material 104) and tails 152 distal interlayer dielectric material 104.

FIG. 2 is a flow diagram illustrating an example process for forming an integrated circuit structure having a high aspect ratio metallization feature, arranged in accordance with at least some implementations of the present disclosure. For example, process 200 may be implemented to fabricate integrated circuit structures illustrated in FIGS. 3A-3F and/or FIGS. 4A-4F. In the illustrated implementation, process 200 includes operations as illustrated by operations 201-208. However, embodiments herein may include additional operations, certain operations being omitted, or operations being performed out of the order provided.

Process 200 begins at operation 201, where a work piece (e.g., a partially fabricated integrated circuit structure) is received such that the partially fabricated integrated circuit structure includes an interlayer dielectric material (ILD) over a metallization. For example, the metallization may be part of a metallization in back end of line (BEOL) processing and the ILD may be formed over the metallization such that the metallization is covered by the ILD. In some embodiments, the metallization is a metallization feature or structure such as a metal line. The metallization may be any suitable metal such as a copper feature or structure. The ILD may be any material that a subsequent self-assembled monolayer may bind to such as silicon oxide, a silicon oxide based material, carbon doped oxide, a carbon doped oxide based material, etc.

Processing continues at operation 202, where an opening is formed in the ILD to expose a top surface of the metallization feature or structure. The opening in the ILD may be formed using any suitable technique or techniques such as patterning and etch techniques. In some embodiments, the opening is formed using single damascene techniques and the opening is an opening shaped to receive a metal via therein. In some embodiments, the opening is formed using dual damascene techniques and the opening is to receive a metal via and a metal line (or interconnect structure) therein. The opening is within sidewalls of the ILD and the top surface of the metallization feature or structure.

Processing continues at operation 203, where a self-assembled monolayer (SAM) is selectively formed on the exposed sidewalls of the ILD in the opening but not on the exposed top surface of the metallization feature or structure. The SAM may be formed using any suitable technique or techniques such as immersion into a solution including the surface active SAM molecules. For example, the molecules of the SAM include head groups that selectively adsorb to or couple to the exposed sidewalls of the ILD in the opening but not to the exposed metal. The bond between the SAM molecules and the ILD may be any suitable chemical bond. The resultant SAM includes molecules having head groups coupled to the ILD sidewalls and tails distal from (i.e., extending away from) the ILD sidewalls. The SAM molecules may be any suitable SAM molecules discussed herein. In some embodiments, the SAM molecules include at least one of a fluorinated alkyl silane, an alkyl chlorosilane, a phosphonate, or an aminosilane. In some embodiments, the SAM molecules include comprise at least one of 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, octadecylphosphonic acid, bis(N,N-dimethylamino)dimethylsilane, or (N,N-dimethylamino)trimethylsilane. Other SAM molecules may be deployed.

The SAM thereby passivates the sidewalls of the ILD such that metal material is not formed thereon. For example, the SAM may selectively attach to the ILD while exposing the top surface of the first metal. Thereby, a subsequent bottom fill (or prefill) of a first metal (e.g., other than copper) may be deployed. Notably, without the SAM, the metal would grow everywhere inclusive of exposed ILD material. As discussed, the SAM includes molecules having head groups that selectively attach to the ILD and tails or tail groups that provide passivation during the subsequent metal deposition.

Processing continues at operation 204, where a first metal is selectively deposited on the exposed top surface of the metallization feature or structure but not on the SAM. Notably, the deposition on the top surface of the metallization feature or structure provides the first metal within a portion of the SAM. The first metal may be deposited using any suitable technique or techniques. In some embodiments, the first metal is deposited using chemical vapor deposition (CVD) such as a timed CVD to provide a desired thickness of the first metal. In some embodiments, the first metal is deposited using physical vapor deposition (PVD) such as a particular number of PVD cycles to provide a desired thickness of the first metal. In some embodiments, such first metal deposition causes SAM residuals to form in the first metal. Such SAM residuals may include intact SAM molecules or portions thereof with a greater percentage of SAM molecule portions due to the processing environment of the first metal deposition decomposing the SAM molecules into, for example, carbon atoms, carbon and hydrogen fragments, or other SAM fragments. The first metal may be any suitable metal such as a metal other than a second metal to be deposited at operation 207. In some embodiments, the first metal is a metal other than copper. Notably, copper would need a liner material and the formation of the liner may destroy the SAM. In some embodiments, the first metal is cobalt, tungsten, titanium, aluminum, ruthenium, molybdenum, manganese, nickel, rhenium, osmium, iridium, platinum, rhodium, or palladium. As discussed, in some embodiments, the first metal deposited at operation 204 may entirely fill the opening and operations 205-207 may be bypassed.

Processing continues at operation 205, where the exposed portion of the SAM is removed. For example, the portion of the SAM that is not between the first metal and the ILD may be removed using any suitable technique or techniques. In some embodiments, at least a portion of the SAM between the first metal and the ILD is also removed as it is exposed during processing. As shown with respect to links between operations 205, 206, in some embodiments, the SAM is removed during formation of a liner material on the sidewalls of the ILD as the harsh processing of the formation of a liner material. In some embodiments, operations 205, 206 are performed separately. The liner material may be formed using any suitable technique or techniques. In some embodiments, the liner material is formed using CVD. In some embodiments, the liner material is formed using PVD. The liner material may include any liner material discussed herein such as tantalum, tantalum and nitrogen (e.g., tantalum nitride), titanium, titanium and nitrogen (e.g., titanium nitride), or tantalum and cobalt.

Processing continues at operation 207, where a second metal or metal fill is disposed in the remainder of the opening. In some embodiments, the metal fill operation is followed by a planarization operation. The second metal may include any suitable material discussed herein such as copper. The second metal may be formed using any suitable technique or techniques such as electroplating techniques. Such operations 201-207 (inclusive of forming an ILD layer as part of operation 201) may be performed any number of times for any number of metallization layers. In some embodiments, vias are formed using single damascene techniques and metal lines are formed using separate single damascene techniques.

Processing continues at operation 208, where a fabricated monolithic integrated circuit formed at least partially using operations 201-207 is output. The monolithic integrated logic circuitry may be further processed and/or packaged in preparation for insertion in a final system or device. The monolithic integrated circuit formed via process 200 may be integrated into any suitable electronics device.

FIGS. 3A, 3B, 3C, 3D, 3E, and 3F are views of example dual damascene integrated circuit device structures as particular fabrication operations are performed, arranged in accordance with at least some implementations of the present disclosure. For example, the integrated circuit device structures of FIGS. 3A-3F may be fabricated in accordance with the operations of process 200.

Figure 3A:
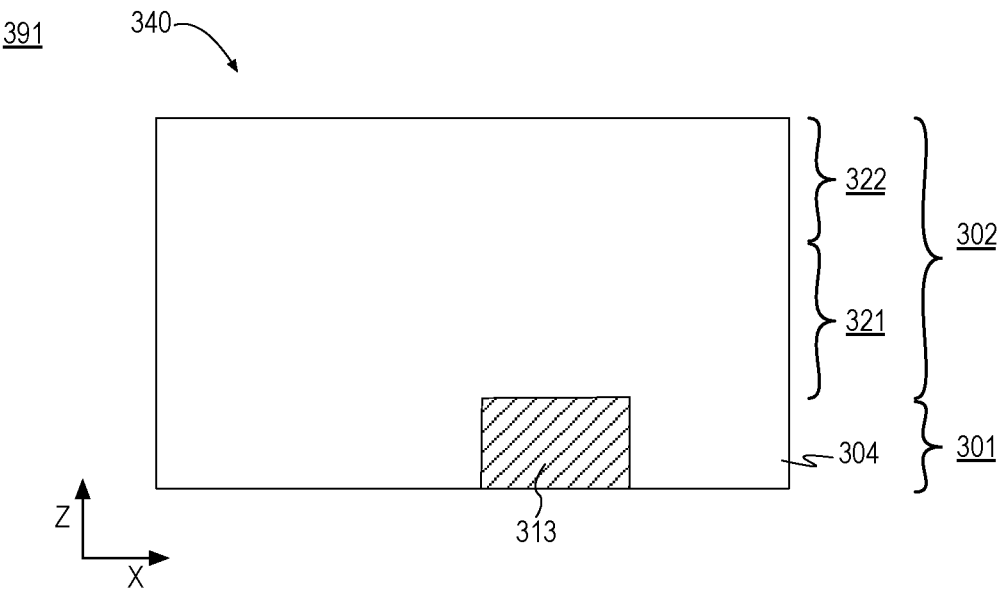
FIGS. 3A, 3B, 3C, 3D, 3E, and 3F are views of example dual damascene integrated circuit device structures as particular fabrication operations are performed.

FIG. 3A illustrates a cross-sectional view 340 of an example integrated circuit device structure 391. As shown in FIG. 3A, integrated circuit device structure 391 includes a metallization structure 313 embedded in an interlayer dielectric material 304. Metallization structure 313 may be a part of a metallization level 301. For example, metallization structure 313 may be a metal line of metallization level 301, which may include a via structure under metallization structure 301 (not shown). Metallization structure 313 may include a liner on side surfaces and optionally on a bottom surface of the illustrated metal fill in the same manner as illustrated in FIG. 4A. A via structure is to be formed in a via layer 321 of metallization level 302 and a metal line structure is to be formed in a metal line layer 322 of metallization level 302. For example, FIGS. 3A-3F illustrate exemplary high aspect ratio dual damascene processing.

Metallization levels 301, 302 may be over a substrate (not shown) having a device layer, which may include transistors, memory devices, capacitors, resistors, optoelectronic devices, switches, or any other active or passive electronic devices, or portions thereof. For example, metallization levels 301, 302 may be BEOL metallization layers of an integrated circuit device. The device layer may be disposed over and/or within a substrate that may include any substrate material discussed herein with respect to FIG. 1A. Metallization structure 313 may include any suitable metal such as copper, cobalt, tungsten, titanium, aluminum, or ruthenium. In an embodiment, metallization structure 313 is or includes copper.

Figure 3B:
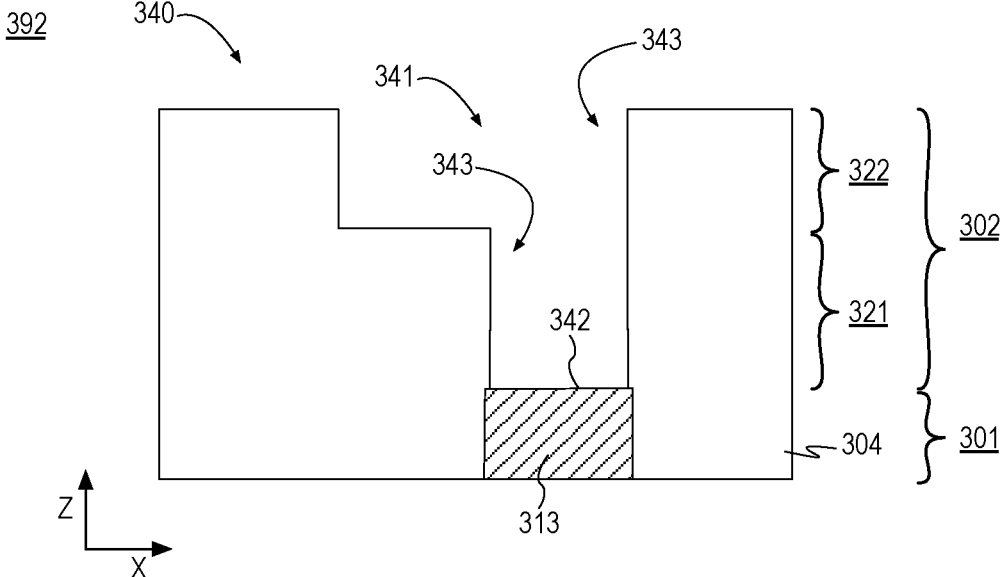
Figure 4A:
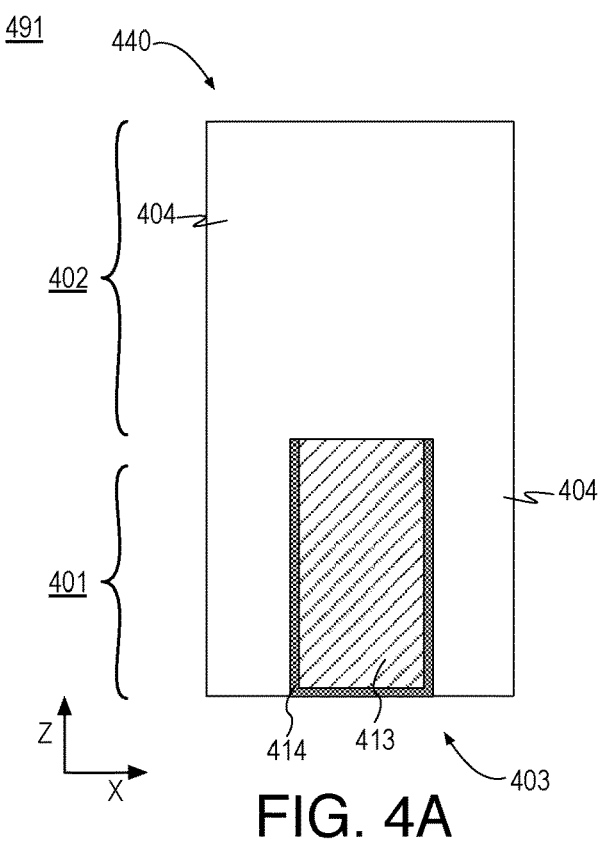
FIGS. 4A, 4B, 4C, 4D, 4E, and 4F are views of example single damascene integrated circuit device structures as particular fabrication operations are performed.

FIG. 3B illustrates an example integrated circuit device structure 392 similar to integrated circuit device structure 391 after patterning an opening 341 in interlayer dielectric material 304. Interlayer dielectric material 304 may include any suitable dielectric material such as silicon oxide, a silicon oxide based material, carbon doped oxide, a carbon doped oxide based material, etc. Opening 341 may be formed using any suitable technique or techniques such as dual damascene techniques such as via first or metal line first dual damascene processing.

As shown, opening 341 is defined by a top surface 342 of metallization structure 313 and sidewalls 343 of interlayer dielectric material 304. Notably, the surfaces of top surface 342 of metallization structure 313 and sidewalls 343 of interlayer dielectric material 304 provide differential surface chemistries for the selective application of a self-assembled monolayer.

Figure 3C:
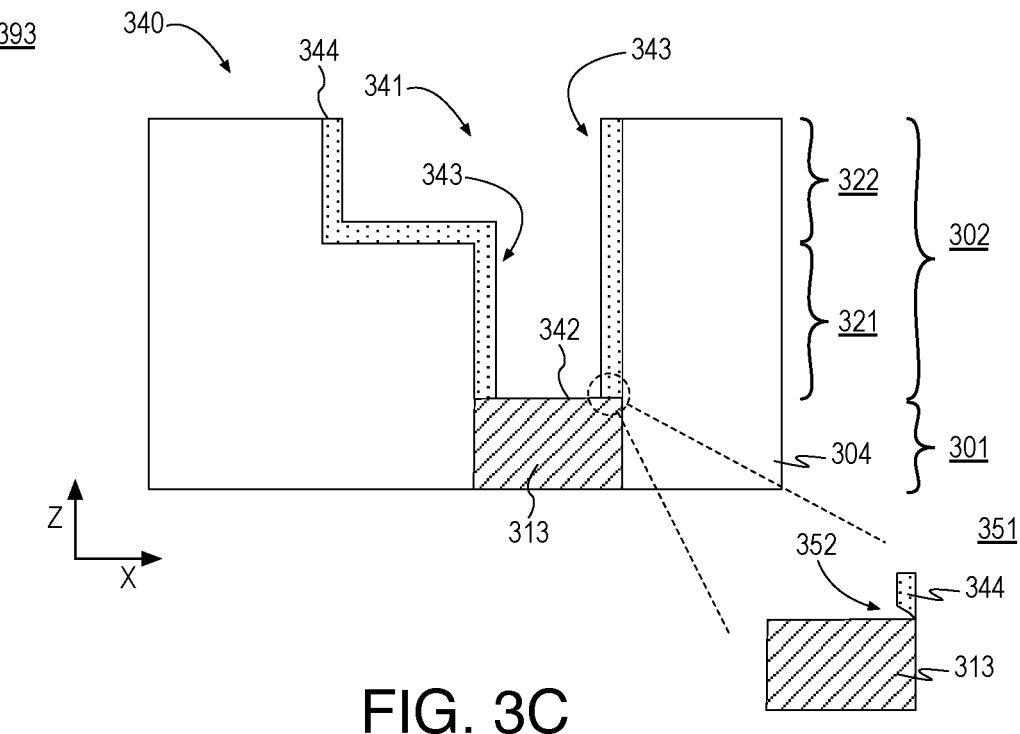

FIG. 3C illustrates an example integrated circuit device structure 393 similar to integrated circuit device structure 392 after the formation of a self-assembled monolayer 344 on sidewalls 343 of interlayer dielectric material 304 but absent at least a portion of top surface 342 of metallization structure 313. Self-assembled monolayer 344 may be formed by immersion into a solution including surface active SAM molecules or other techniques. Self-assembled monolayer 344 may include any suitable self-assembled monolayer molecules discussed herein such as 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, octadecylphosphonic acid, bis(N,N-dimethylamino)dimethylsilane, or (N,N-dimethylamino)trimethylsilane.

As shown with respect to enlarged view 351, in some embodiments, self-assembled monolayer 344 may include a tapered edge 352 as the surface active SAM molecules are highly selective to bonding with interlayer dielectric material 304 and not bonding with metallization structure 313. In other embodiments, the taper may not be evident but essentially no SAM molecules bond to any exposed surface of metallization structure 313.

Figure 3D:
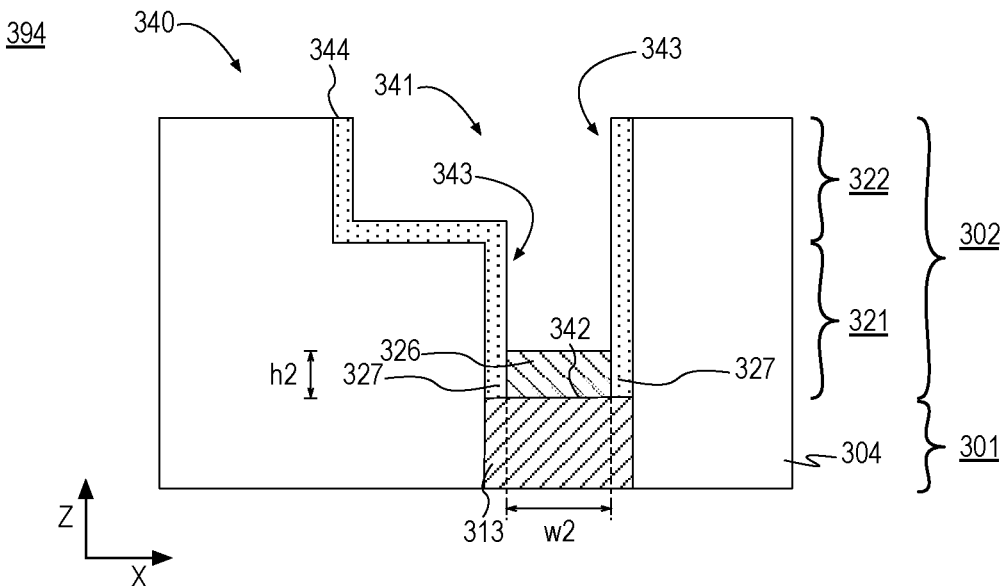

FIG. 3D illustrates an example integrated circuit device structure 394 similar to integrated circuit device structure 393 after the formation of a first metal portion 326 on top surface 342 of metallization structure 313 and adjacent portions 327 of self-assembled monolayer 344. First metal portion 326 may be any suitable metal that does not require a liner material. In some embodiments, first metal portion 326 is or includes one of cobalt, tungsten, titanium, aluminum, ruthenium, molybdenum, manganese, nickel, rhenium, osmium, iridium, platinum, rhodium, or palladium. First metal portion 326 may be provided at any suitable thickness h2 such as a thickness in the range of 10 to 50 nm. In some embodiments, first metal portion 326 has a thickness in the range of 10 to 20 nm. First metal portion 326 may have any suitable width such as a width in the range of 15 to 50 nm. First metal portion 326 may be provided at any suitable thickness such as those discussed with respect to FIG. 3D. First metal portion 326 may be deposited using any suitable technique or techniques such as a timed CVD process or a PVD process.

In some embodiments, forming first metal portion 326 causes residuals of the molecules of self-assembled monolayer 344 to remain therein. Such residuals may be entire intact SAM molecules or portions of SAM modules such as head groups, tails, portions of head groups, portions of tails, or the like as discussed with respect to SAM residuals 128. As discussed, in some embodiments, first metal portion 326 may entirely fill opening 341 and subsequent self-assembled monolayer removal and second metal fill operations may be bypassed such that metallization feature or structure 330 is entirely the first metal and self-assembled monolayer 344 remains on sidewalls of opening 341.

Figures 3E, 3F:
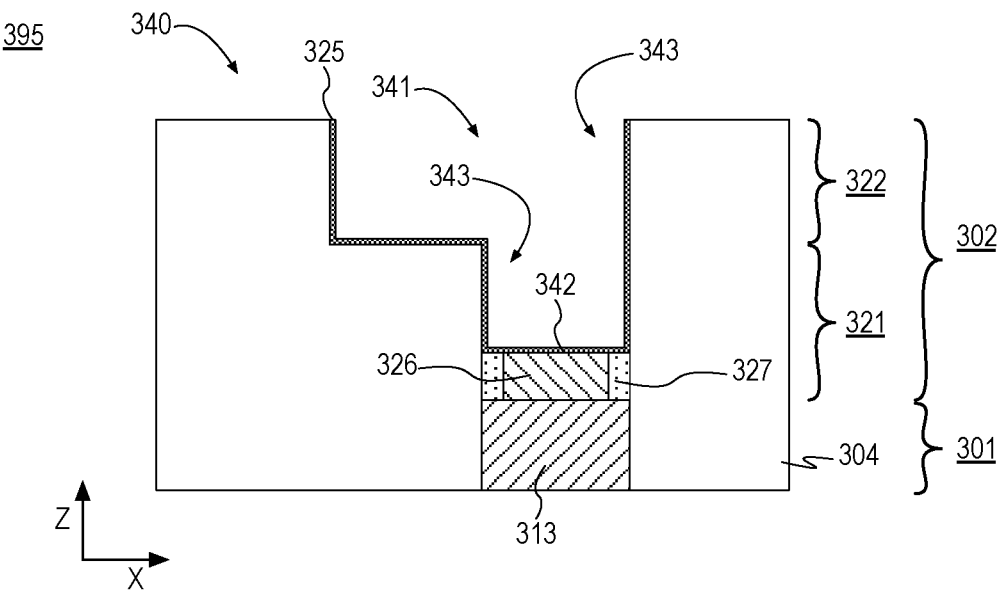

FIG. 3E illustrates an example integrated circuit device structure 395 similar to integrated circuit device structure 394 after the removal of exposed portions of self-assembled monolayer 344 and formation of liner material 325. In some embodiments, the exposed portions of self-assembled monolayer 344 are removed and liner material 325 is formed in the same process operations such as CVD or PVD processing. In some embodiments, exposed portions of self-assembled monolayer 344 adjacent top surface 342 are also removed during such processing such that self-assembled monolayer portion 327 recesses below top surface 342.

Liner material 325 may include any suitable material that is capable reducing or eliminating diffusion of a subsequent fill metal such as copper. In some embodiments, liner material 325 is or includes one or more of tantalum, tantalum and nitrogen (e.g., tantalum nitride), titanium, titanium and nitrogen (e.g., titanium nitride), or tantalum and cobalt. Other liner materials may be used.

FIG. 3F illustrates an example integrated circuit device structure 396 similar to integrated circuit device structure 395 after the formation of a fill metal within opening 341 to provide a second metal portion 324 and a third metal portion 329 of metallization feature or structure 330. For example, second metal portion 324 and third metal portion 329 are formed in the same metallization operation (e.g., electroplating operation) and are a continuous metal material.

Second metal portion 324, along with first metal portion 326, provides a via structure of metallization feature or structure 330 and third metal portion 329 provides a metal line of metallization feature or structure 330 as shown with respect to second metal portion 324 being part of via layer 321 and third metal portion 329 being part of metal line layer 322. As discussed, metallization feature or structure 330 has a greater aspect ratio than that attainable by providing the metal fill alone.

FIGS. 4A, 4B, 4C, 4D, 4E, and 4F are views of example single damascene integrated circuit device structures as particular fabrication operations are performed, arranged in accordance with at least some implementations of the present disclosure. For example, the integrated circuit device structures of FIGS. 4A-4F may be fabricated in accordance with the operations of process 200.

FIG. 4A illustrates a cross-sectional view 440 of an example integrated circuit device structure 491. Integrated circuit device structure 491 includes a metallization structure 403 embedded in an interlayer dielectric material 404. Metallization structure 403 includes a bulk metal portion 413 and a liner material 414. In some embodiments, metallization structure 403 is absent liner material 414 or liner material 414 may be absent the bottom surface bulk metal portion 413. Metallization structure 403 may be a part of a metallization level 401. For example, metallization structure 403 may be a metal line of metallization level 401, which may include a via structure under metallization structure 403 (not shown). A via structure is to be formed in a via layer of metallization level 402. A metal line structure may then be formed in a metal line layer (not shown) of metallization level 402. For example, FIGS. 4A-4F illustrate exemplary high aspect ratio dual damascene processing.

Metallization levels 401, 402 may be over a substrate (not shown) having a device layer, which may include transistors, memory devices, capacitors, resistors, optoelectronic devices, switches, or any other active or passive electronic devices, or portions thereof. For example, metallization levels 401, 402 may be BEOL metallization layers of an integrated circuit device. The device layer may be disposed over and/or within a substrate that may include any substrate material discussed herein. Bulk metal portion 413 of metallization structure 403 may include any suitable metal such as copper, cobalt, tungsten, titanium, aluminum, or ruthenium. In an embodiment, bulk metal portion 413 is or includes copper and liner material 414 is a material that inhibits or stops the diffusion of copper from bulk metal portion 413. For example, liner material 414 may be tantalum, tantalum and nitrogen (e.g., tantalum nitride), titanium, titanium and nitrogen (e.g., titanium nitride), or tantalum and cobalt.

Figure 4B:
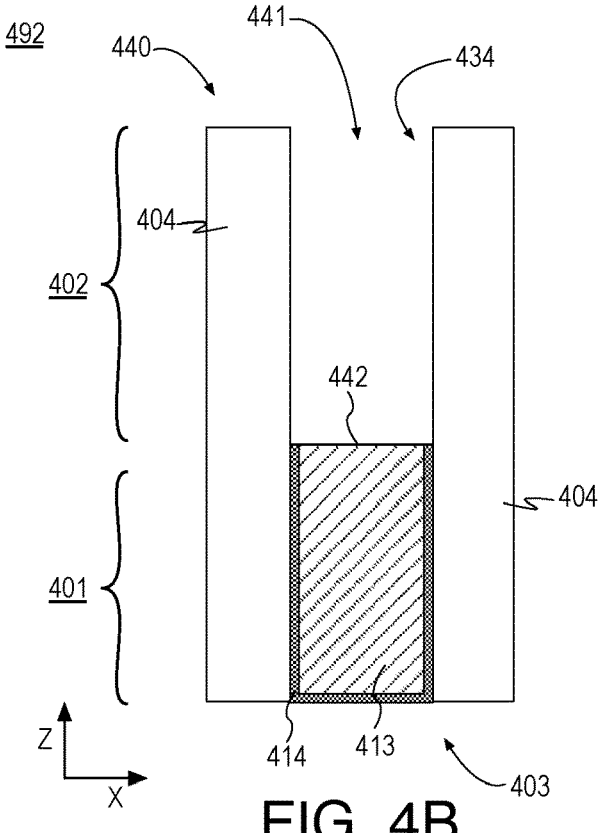

FIG. 4B illustrates an example integrated circuit device structure 492 similar to integrated circuit device structure 491 after patterning an opening 441 in interlayer dielectric material 404. Interlayer dielectric material 404 may include any suitable dielectric material such as silicon oxide, a silicon oxide based material, carbon doped oxide, a carbon doped oxide based material, etc. Opening 441 may be formed using any suitable technique or techniques such as single damascene techniques inclusive of patterning and etch techniques.

Opening 441 is defined by a top surface 442 of metallization structure 403 and sidewalls 434 of interlayer dielectric material 404. The surfaces of top surface 442 of metallization structure 403 and sidewalls 434 of interlayer dielectric material 404 provide differential surface chemistries for the selective application of a self-assembled monolayer.

Figure 4C:
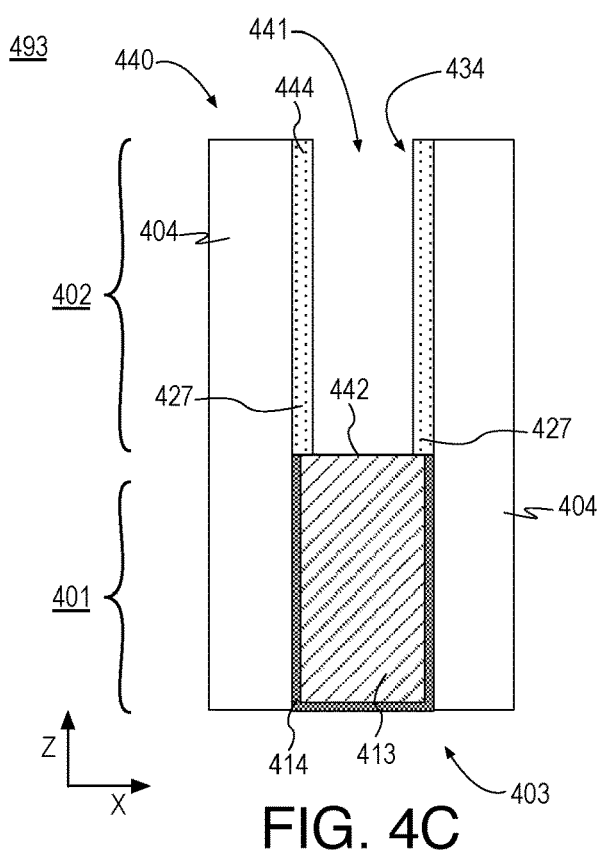

FIG. 4C illustrates an example integrated circuit device structure 493 similar to integrated circuit device structure 492 after the formation of a self-assembled monolayer 444 on sidewalls 434 of interlayer dielectric material 404 but absent at least a portion of top surface 442 of metallization structure 403. Self-assembled monolayer 444 may be formed using any suitable technique or techniques such as immersion in a solution including active SAM molecules. Self-assembled monolayer 444 may include any suitable self-assembled monolayer molecules such as 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, octadecylphosphonic acid, bis(N, N-dimethylamino)dimethylsilane, or (N,N-dimethylamino) trimethylsilane. In some embodiments, the SAM molecules include at least one of a fluorinated alkyl silane, an alkyl chlorosilane, a phosphonate, or an aminosilane. In some embodiments, the SAM molecules have head groups including one or more of a silane, a chlorosilane, a phosphonate, an aminosilane, a siloxane, a silyl chloride, an alkene, an alkyne, an amine, a phosphine, a thiol, a phosphonic acid, or a carboxylic acid and a tail group of an alkyl chain having two to 18 carbon atoms.

Figure 4D:
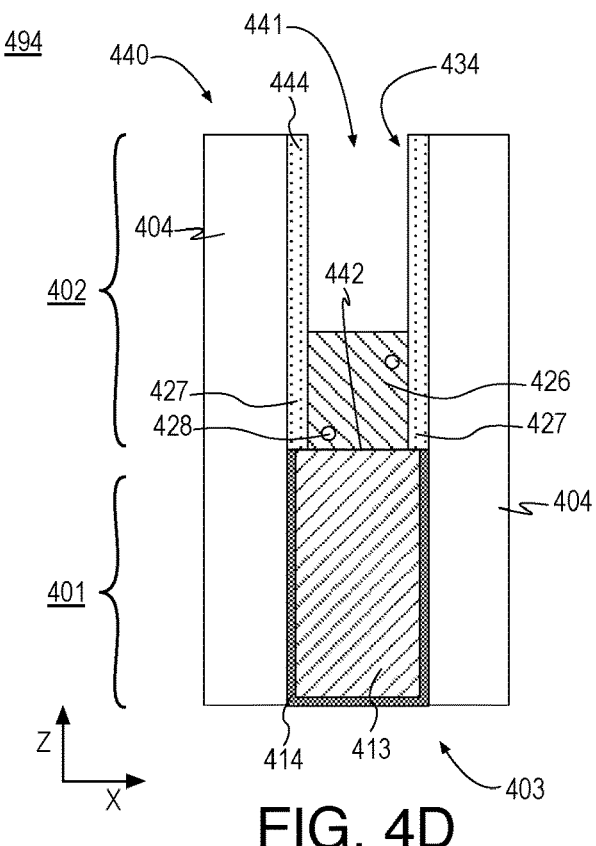

FIG. 4D illustrates an example integrated circuit device structure 494 similar to integrated circuit device structure 493 after the formation of a first metal portion 426 on top surface 442 of metallization structure 403 and adjacent portions 427 of self-assembled monolayer 444. First metal portion 426 may be any suitable metal that does not require a liner material. In some embodiments, first metal portion 326 is or includes one of ruthenium, cobalt, tungsten, titanium, aluminum, ruthenium, molybdenum, manganese, nickel, rhenium, osmium, iridium, platinum, rhodium, or palladium with ruthenium being particularly advantageous. First metal portion 426 may be provided at any suitable thickness such as those discussed with respect to FIG. 3D. First metal portion 426 may be deposited using any suitable technique or techniques such as a timed CVD process or a PVD process.

In some embodiments, forming first metal portion 426 causes SAM residuals 428 of the molecules of self-assembled monolayer 444 to be disposed within first metal portion 426. SAM residuals 428 may be entire intact SAM molecules or portions of SAM modules such as head groups, tails, portions of head groups, portions of tails, or the like. In some embodiments, SAM residuals 428 are or include silane. In some embodiments, SAM residuals 428 are or include phosphonate. In some embodiments, SAM residuals 428 are or include a silane, a chlorosilane, a phosphonate, an aminosilane, a siloxane, a silyl chloride, an alkene, an alkyne, an amine, a phosphine, a thiol, a phosphonic acid, or a carboxylic acid. In some embodiments, SAM residuals 428 are or include carbon and hydrogen. SAM residuals 428 may include other elemental or molecular residuals from the molecules of self-assembled monolayer 444.

In some embodiments, first metal portion 426 entirely fills opening 441. In such embodiments, subsequent self-assembled monolayer removal and second metal fill operations may be bypassed such that resultant metallization feature or structure 423 is entirely the first metal and self-assembled monolayer 444 remains on sidewalls of opening 441.

Figure 4E:
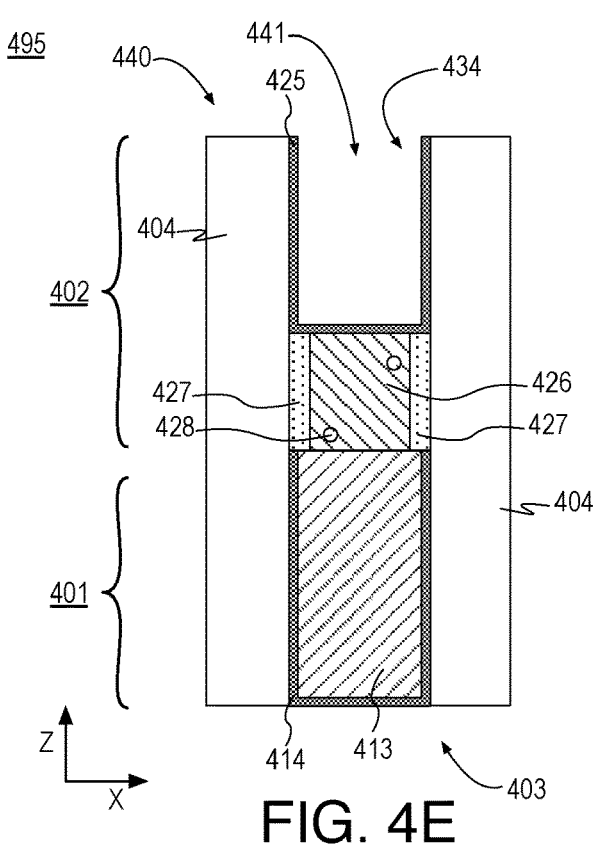

FIG. 4E illustrates an example integrated circuit device structure 495 similar to integrated circuit device structure 494 after the removal of exposed portions of self-assembled monolayer 444 and formation of liner material 425. In some embodiments, the exposed portions of self-assembled monolayer 444 are removed and liner material 425 is formed in the same process operations such as a CVD operation or a PVD operation. Exposed portions of self-assembled monolayer 444 adjacent top surface 442 may also removed during such processing such that self-assembled monolayer 444 recesses below top surface 442.

Liner material 425 may include any suitable material that reduces or eliminates diffusion of a subsequent fill metal such as a copper fill metal. For example, liner material 425 may include one or more of tantalum, tantalum and nitrogen (e.g., tantalum nitride), titanium, titanium and nitrogen (e.g., titanium nitride), or tantalum and cobalt.

Figure 4F:
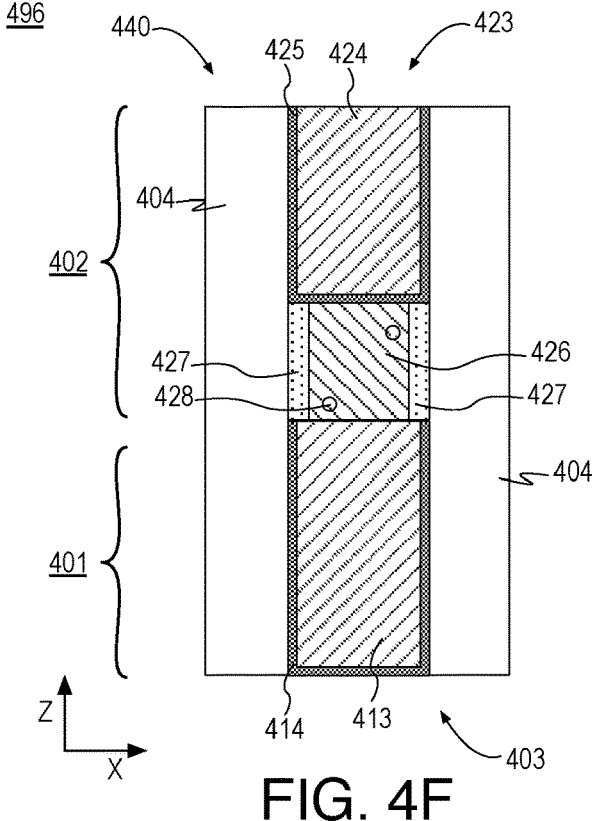

FIG. 4F illustrates an example integrated circuit device structure 496 similar to integrated circuit device structure 495 after the formation of a fill metal within opening 441 to provide a second metal portion 424 of a metallization feature or structure 423. For example, second metal portion 424 and first metal portion 426 may be a via structure of metallization level 402, which may also include metal lines over such via structures. Metallization feature or structure 423 has a greater aspect ratio than that attainable by providing the metal fill of second metal portion 424 alone.

As discussed, herein, the material of a self-assembled monolayer is selected to only passivate interlayer dielectric material but not a top surface of a metallization feature (e.g., a copper surface) being contacted. A subsequent prefill metal deposition is then only deposited at the bottom of a via opening while the sidewall surface of the interlayer dielectric material is left clean. A second fill is then performed with the prefill metal reducing the aspect ratio of the second fill (e.g., reducing the aspect ratio of the single or dual damascene feature that is to be filled by the second fill metal). The second fill may then be performed under processing conditions that fill the remaining feature with relatively wide process parameters (e.g., with relative ease) and a high quality resultant fill. Such processing may be performed in singe or dual damascene process flows. Thereby, high aspect ratio metallization features or structures are attained with little or no defect on the interlayer dielectric sidewalls, particularly the interlayer dielectric sidewalls adjacent the second fill metal.

Figure 5:
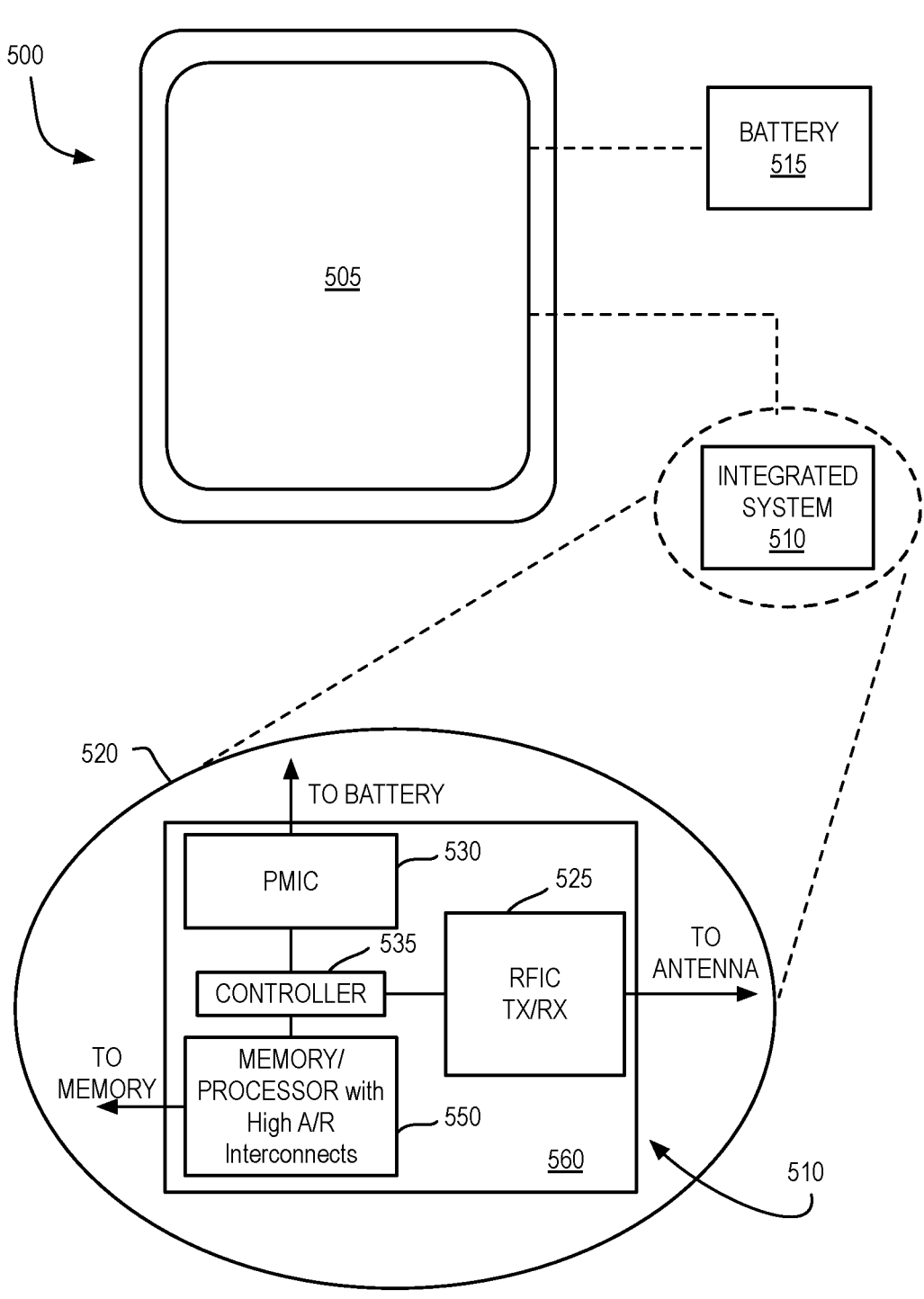
FIG. 5 is an illustrative diagram of a mobile computing platform employing an integrated circuit having a high aspect ratio metallization feature or structure.

FIG. 5 is an illustrative diagram of a mobile computing platform 500 employing an integrated circuit having a high aspect ratio metallization feature or structure, arranged in accordance with at least some implementations of the present disclosure. Any integrated circuit device or structure having any components, materials, or characteristics discussed herein may be implemented by any component of mobile computing platform 500. For example, one or more of integrated circuit device structures 100, 396, 496 or other device structures discussed herein may be deployed by any component of mobile computing platform 500. Mobile computing platform 500 may be any portable device configured for each of electronic data display, electronic data processing, wireless electronic data transmission, or the like. For example, mobile computing platform 500 may be any of a tablet, a smart phone, a netbook, a laptop computer, etc. and may include a display screen 505, which in the exemplary embodiment is a touchscreen (e.g., capacitive, inductive, resistive, etc. touchscreen), a chip-level (system on chip—SoC) or package-level integrated system 510, and a battery 515. Battery 515 may include any suitable device for providing electrical power such as a device consisting of one or more electrochemical cells and electrodes to couple to an outside device. Mobile computing platform 500 may further include a power supply to convert a source power from a source voltage to one or more voltages employed by other devices of mobile computing platform 500.

Integrated system 510 is further illustrated in the expanded view 520. In the exemplary embodiment, packaged device 550 (labeled "Memory/Processor" in FIG. 5) includes at least one memory chip (e.g., RAM), and/or at least one processor chip (e.g., a microprocessor, a multi-core microprocessor, or graphics processor, or the like). In an embodiment, the package device 550 is a microprocessor including an SRAM cache memory. As shown, device 550 may employ a die or device having any transistor structures and/or related characteristics discussed herein. Packaged device 550 may be further coupled to (e.g., communicatively coupled to) a board, a substrate, or an interposer 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller 535 thereof. In general, packaged device 550 may be also be coupled to (e.g., communicatively coupled to) display screen 505. As shown, one or both of PMIC 530 and/or RFIC 525 may employ a die or device having any transistor structures and/or related characteristics discussed herein.

Functionally, PMIC 530 may perform battery power regulation, DC-to-DC conversion, etc., and so has an input coupled to battery 515 and with an output providing a current supply to other functional modules. In an embodiment, PMIC 530 may perform high voltage operations. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 550 or within a single IC (SoC) coupled to the package substrate of the packaged device 550.

Figure 6:
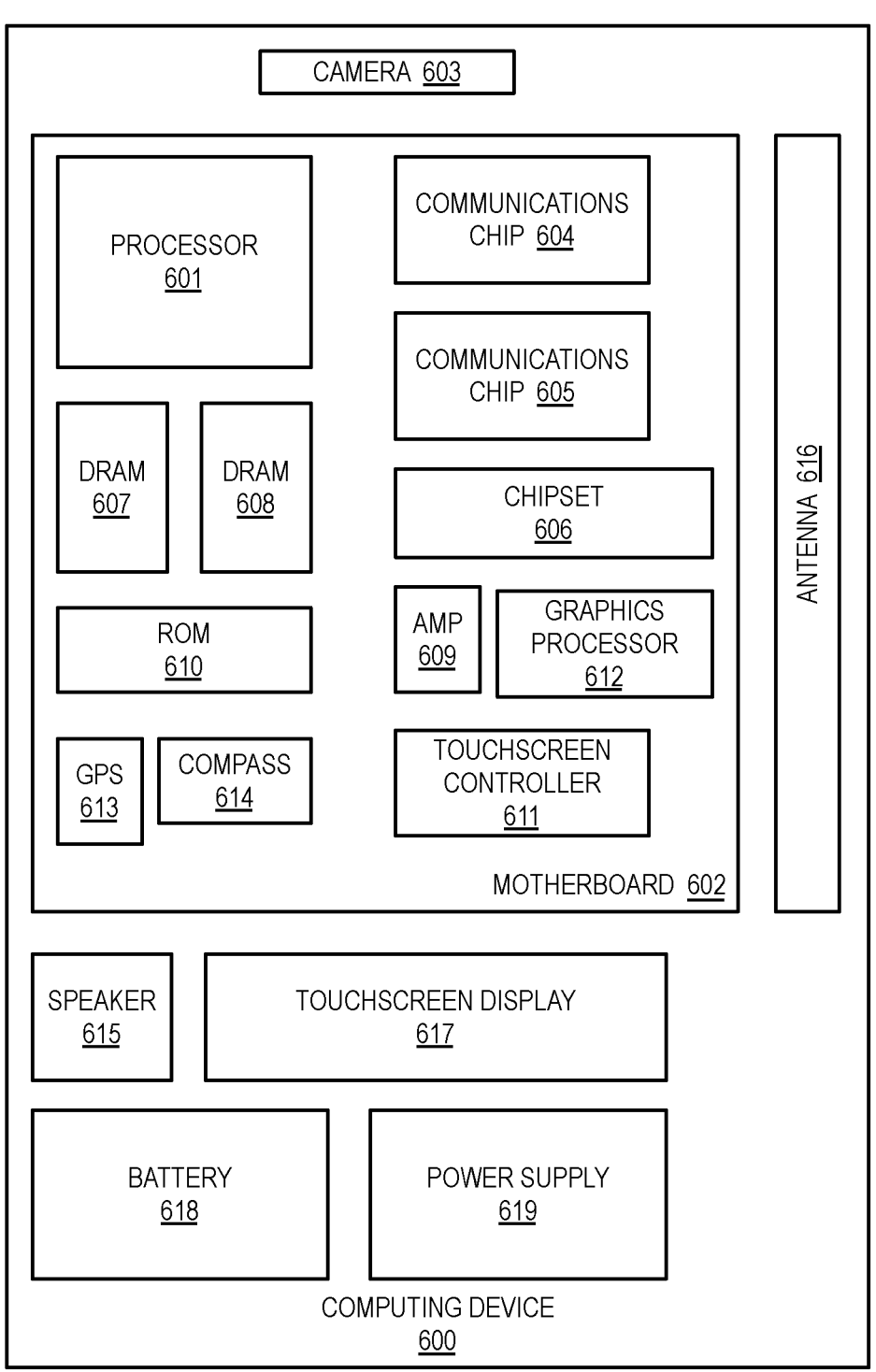
FIG. 6 is a functional block diagram of a computing device, all arranged in accordance with at least some implementations of the present disclosure.

FIG. 6 is a functional block diagram of a computing device 600, arranged in accordance with at least some implementations of the present disclosure. Computing device 600 may be found inside platform 500, for example, and further includes a motherboard 602 hosting a number of components, such as but not limited to a processor 601 (e.g., an applications processor) and one or more communications chips 604, 605. Processor 601 may be physically and/or electrically coupled to motherboard 602. In some examples, processor 601 includes an integrated circuit die packaged within the processor 601. In general, the term "processor" may refer to any device or portion of a device that processes electronic data from registers and/or memory to transform that electronic data into other electronic data that may be stored in registers and/or memory. Any one or more device or component of computing device 600 may include an integrated circuit having a high aspect ratio metallization feature or structure with any related characteristics discussed herein.

In various examples, one or more communication chips 604, 605 may also be physically and/or electrically coupled to the motherboard 602. In further implementations, communication chips 604 may be part of processor 601. Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics processor 612, flash memory, global positioning system (GPS) device 613, compass 614, a chipset 606, an antenna 616, a power amplifier 609, a touchscreen controller 611, a touchscreen display 617, a speaker 615, a camera 603, a battery 618, and a power supply 619, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 604, 605 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 604, 605 may implement any of a number of wireless standards or protocols, including but not limited to those described elsewhere herein. As discussed, computing device 600 may include a plurality of communication chips 604, 605. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 619 may convert a source power from a source voltage to one or more voltages employed by other devices of computing device 600 (or mobile computing platform 500). In some embodiments, power supply 619 converts an AC power to DC power. In some embodiments, power supply 619 converts an DC power to DC power at one or more different (lower) voltages. In some embodiments, multiple power supplies are staged to convert from AC to DC and then from DC at a higher voltage to DC at a lower voltage as specified by components of computing device 600.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, an integrated circuit device comprises a first metallization level comprising a first metallization feature, a second metallization level over the first metallization level, the second metallization level comprising a second metallization feature on the first metallization feature and within an interlayer dielectric material, the second metallization feature comprising a first portion on the first metallization feature and a second portion over the first portion, the first portion comprising a first metal and the second portion comprising the first metal or a second metal, and a layer between at least the first portion of the second metallization feature and the interlayer dielectric material, the layer comprising a plurality of molecules having at least head groups coupled to the interlayer dielectric material and tails distal the interlayer dielectric material.

In one or more second embodiments, further to the first embodiment, the molecules of the layer comprise at least one of a fluorinated alkyl silane, an alkyl chlorosilane, a phosphonate, or an aminosilane.

In one or more third embodiments, further to the first or second embodiments, the molecules of the layer comprise at least one of 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, bis(N,N-dimethylamino)dimethylsilane, or (N,N-dimethylamino)trimethylsilane.

In one or more fourth embodiments, further to any of the first through third embodiments, the first portion of the second metallization feature comprises at least one of fluorine, chlorine, phosphorous, or nitrogen.

In one or more fifth embodiments, further to any of the first through fourth embodiments, the first portion of the second metallization feature comprises carbon and hydrogen.

In one or more sixth embodiments, further to any of the first through fifth embodiments, the second metallization feature comprises a via of the second metallization level.

In one or more seventh embodiments, further to any of the first through sixth embodiments, the first portion of the second metallization feature has a width that is less than a width of the second portion of the second metallization feature.

In one or more eighth embodiments, further to any of the first through seventh embodiments, the second metallization feature further comprises a third portion on the second portion, the third portion comprising the first metal or the second metal, wherein the third portion comprises a line of the second metallization level.

In one or more ninth embodiments, further to any of the first through eighth embodiments, the second portion comprises the second metal.

In one or more tenth embodiments, further to any of the first through ninth embodiments, the first metal comprises one of cobalt, tungsten, titanium, aluminum, molybdenum, or ruthenium, and the second metal comprises copper.

In one or more eleventh embodiments, further to any of the first through tenth embodiments, the second metallization feature further comprises a second layer between the first portion and the second portion, the second layer comprising one of tantalum, tantalum and nitrogen, titanium, titanium and nitrogen, or tantalum and cobalt.

In one or more twelfth embodiments, further to any of the first through eleventh embodiments, the second layer extends between the interlayer dielectric material and the second portion of the second metallization feature.

In one or more thirteenth embodiments, a system comprises a power supply and an integrated circuit die coupled to the power supply, the integrated circuit die comprising an integrated circuit device according to any of the first through twelfth embodiments.

In one or more fourteenth embodiments, a system comprises a first monolithic integrated circuit die comprising a first metallization level, a second metallization structure of a second metallization level, the second metallization structure on a portion of the first metallization level and embedded in an interlayer dielectric material, the second metallization structure comprising a first portion on the portion of the first metallization level and a second portion over the first portion, the first portion comprising a first metal and the second portion comprising a second metal, and a layer between the first portion and the interlayer dielectric material, the layer comprising a plurality of molecules having at least head groups coupled to the interlayer dielectric material and tails distal the interlayer dielectric material, and a power supply coupled to the first monolithic integrated circuit die.

In one or more fifteenth embodiments, further to the fourteenth embodiment, the molecules of the layer comprise at least one of a fluorinated alkyl silane, an alkyl chlorosilane, a phosphonate, or an aminosilane.

In one or more sixteenth embodiments, further to the fourteenth or fifteenth embodiments, the molecules of the layer comprise at least one of 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, octadecylphosphonic acid, bis(N,N-dimethylamino)dimethylsilane, or (N,N-dimethylamino)trimethylsilane.

In one or more seventeenth embodiments, further to any of the fourteenth through sixteenth embodiments, the second metallization feature comprises a via of the second metallization level, and the first portion of the second metallization feature has a width that is less than a width of the second portion of the second metallization feature.

In one or more eighteenth embodiments, a method comprises forming an opening in an interlayer dielectric material, the opening exposing a top surface of a metallization feature of a first metallization level and within one or more sidewalls of the interlayer dielectric material, forming a self-assembled monolayer on the sidewalls of the interlayer dielectric material, depositing a first metal on the top surface of the metallization feature and immediately adjacent a portion of the self-assembled monolayer, removing a second portion of the self-assembled monolayer, and depositing a second metal within the opening and over the first metal.

In one or more nineteenth embodiments, further to the eighteenth embodiment, the self-assembled monolayer comprises at least one of a fluorinated alkyl silane, an alkyl chlorosilane, a phosphonate, or an aminosilane.

In one or more twentieth embodiments, further to eighteenth first or nineteenth embodiments, the self-assembled monolayer comprises of the layer comprise at least one of 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, octadecylphosphonic acid, bis(N,N-dimethylamino)dimethylsilane, or (N,N-dimethylamino)trimethylsilane.

In one or more twenty-first embodiments, further to any of the eighteenth through twentieth embodiments, said depositing the first metal decomposes a portion of the self-assembled monolayer into the first metal.

In one or more twenty-second embodiments, further to any of the eighteenth through twenty-first embodiments, the method further comprises forming a liner on the first metal and on a portion of the sidewalls of the interlayer dielectric material, wherein the second metal is deposited on the liner.

In one or more twenty-third embodiments, further to any of the eighteenth through twenty-second embodiments, said removing the second portion of the self-assembled monolayer and said forming the liner are performed in the same operation.

In one or more twenty-fourth embodiments, further to any of the eighteenth through twenty-third embodiments, the second metallization feature is a via of the second metallization level, and the first portion of the second metallization feature has a width that is less than a width of the second portion of the second metallization feature.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit device, comprising:
a first metallization level comprising a metallization feature;
a second metallization level over the first metallization level, the second metallization level comprising a metal via on the metallization feature and a metal line on the metal via, wherein the metal via and the metal line are within an interlayer dielectric material, the metal via comprising a first portion on the metallization feature and a second portion on the first portion, the first portion comprising a first metal and the second portion comprising the first metal or a second metal; and
a layer between the first portion of the metal via and the interlayer dielectric material, the layer comprising a plurality of molecules having at least head groups coupled to the interlayer dielectric material and tails distal the interlayer dielectric material, wherein the second portion of the metal via is on the interlayer dielectric material and the first portion has a width that is less than a width of the second portion.

2. The integrated circuit device of claim 1, wherein the molecules of the layer comprise at least one of a fluorinated alkyl silane, an alkyl chlorosilane, a phosphonate, or an aminosilane.

3. The integrated circuit device of claim 1, wherein the molecules of the layer comprise at least one of 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, bis(N,N-dimethylamino)dimethylsilane, or (N,N-dimethylamino)trimethylsilane.

4. The integrated circuit device of claim 1, wherein the first portion of the metal via comprises at least one of fluorine, chlorine, phosphorous, carbon, hydrogen, or nitrogen.

5. The integrated circuit device of claim 1, wherein the second portion of the metal via comprises the second metal.

6. The integrated circuit device of claim 5, wherein the first portion of the metal via has a height that is less than a height of the second portion.

7. The integrated circuit device of claim 5, wherein the metal line comprises the second metal.

8. The integrated circuit device of claim 7, wherein the metal line comprises a liner comprising one of tantalum, tantalum and nitrogen, titanium, titanium and nitrogen, or tantalum and cobalt and a fill metal comprising the second metal, and wherein the fill metal is on the second portion of the metal via.

9. The integrated circuit device of claim 8, wherein the liner extends between the interlayer dielectric material and the second portion of the metal via.

10. The integrated circuit device of claim 7, wherein the first metal comprises one of cobalt, tungsten, titanium, aluminum, molybdenum, or ruthenium, and wherein the second metal comprises copper.

11. The integrated circuit device of claim 1, further comprising:
an integrated circuit die comprising the first metallization level, the second metallization level, and the layer; and
a power supply coupled to the integrated circuit die.

12. An integrated circuit device, comprising:
a first metallization level comprising a metallization feature;
a second metallization level comprising a metal via and a metal line within an interlayer dielectric material, the metal via comprising a first portion on the metallization feature and a second portion on the first portion, the first portion comprising a first metal and the second portion comprising the first metal or a second metal; and
a layer between the first portion and the interlayer dielectric material, the layer comprising a plurality of molecules having at least head groups coupled to the interlayer dielectric material and tails distal the interlayer dielectric material, wherein the second portion is on the interlayer dielectric material, and the first portion has a width that is less than a width of the second portion.

13. The integrated circuit device of claim 12, wherein the molecules of the layer comprise at least one of a fluorinated alkyl silane, an alkyl chlorosilane, a phosphonate, or an aminosilane.

14. The integrated circuit device of claim 12, wherein the molecules of the layer comprise at least one of 1H, 1H, 2H, 2H-perfluorooctyltrichlorosilane, (heptadecafluoro-1,1,2,2-tetrahydrodecyl)triethoxysilane, octadecyltrichlorosilane, octadecylphosphonic acid, bis(N,N-dimethylamino)dimethylsilane, or (N,N-dimethylamino)trimethylsilane.

15. The integrated circuit device of claim 12, wherein the first portion comprises at least one of fluorine, chlorine, phosphorous, carbon, hydrogen, or nitrogen.

16. The integrated circuit device of claim 12, wherein the second portion comprises the second metal.

17. The integrated circuit device of claim 16, wherein the first portion has a height that is less than a height of the second portion.

18. The integrated circuit device of claim 16, wherein the metal line comprises the second metal.

19. The integrated circuit device of claim 18, wherein the metal line comprises a liner comprising one of tantalum, tantalum and nitrogen, titanium, titanium and nitrogen, or tantalum and cobalt and a fill metal comprising the second metal, wherein the fill metal is on the second portion.

20. The integrated circuit device of claim 19, wherein the liner extends between the interlayer dielectric material and the second portion.

21. The integrated circuit device of claim 18, wherein the first metal comprises one of cobalt, tungsten, titanium, aluminum, molybdenum, or ruthenium, and wherein the second metal comprises copper.

22. The integrated circuit device of claim 12, further comprising:

an integrated circuit die comprising the first metallization level, the second metallization level, and the layer; and a power supply coupled to the integrated circuit die.

* * * * *